US010326052B1

(12) United States Patent
Percival

(10) Patent No.: US 10,326,052 B1
(45) Date of Patent: Jun. 18, 2019

(54) LIGHT EMITTING DIODE WITH FIELD ENHANCED CONTACT

(71) Applicant: Facebook Technologies, LLC, Menlo Park, CA (US)

(72) Inventor: Christopher Percival, Blarney (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/894,831

(22) Filed: Feb. 12, 2018

(51) Int. Cl.
| H01L 33/00 | (2010.01) |
| H01L 33/24 | (2010.01) |
| H01L 33/42 | (2010.01) |
| H01L 33/06 | (2010.01) |
| H01L 33/32 | (2010.01) |

(52) U.S. Cl.
CPC .......... H01L 33/24 (2013.01); H01L 33/0075 (2013.01); H01L 33/06 (2013.01); H01L 33/325 (2013.01); H01L 33/42 (2013.01)

(58) Field of Classification Search
CPC ..... H01L 33/24; H01L 33/0075; H01L 33/06; H01L 33/325; H01L 33/42; H01L 33/38; H01L 33/20; H01L 33/387; H01L 33/40
See application file for complete search history.

(56) References Cited

U.S. PATENT DOCUMENTS

| 6,518,598 | B1* | 2/2003 | Chen | H01L 33/20 |
| | | | | 257/690 |
| 7,518,149 | B2* | 4/2009 | Maaskant | H01L 31/035281 |
| | | | | 257/79 |
| 2006/0113638 | A1* | 6/2006 | Maaskant | H01L 31/035281 |
| | | | | 257/623 |
| 2012/0032140 | A1* | 2/2012 | Li | H01L 33/0012 |
| | | | | 257/13 |
| 2015/0180488 | A1* | 6/2015 | Tanaka | G04F 5/145 |
| | | | | 331/94.1 |
| 2018/0248144 | A1* | 8/2018 | Carroll | H01L 51/504 |

* cited by examiner

Primary Examiner — Nikolay K Yushin
(74) Attorney, Agent, or Firm — Fenwick & West LLP

(57) ABSTRACT

Embodiments relate to a light emitting structure including a light emitting diode, a first contact, and a second contact. The light emitting diode includes a body of transparent semiconductor material with a top surface and a light emitting region below the top surface. The light emitting region emits light in response to current passing through the light emitting region; the emitted light passes through the body of the light emitting diode. The first contact is connected to the top surface of the body and has a spiral shape to induce an electromagnetic field. The electromagnetic field shapes the light emitted from the light emitting region and passes through the body of the light emitting diode. The second contact is connected to a surface of the light emitting structure. A voltage difference can be applied across the first contact and second contact to generate the current through the light emitting region.

16 Claims, 3 Drawing Sheets

LIGHT EMITTING DIODE WITH FIELD ENHANCED CONTACT

BACKGROUND

This disclosure relates to a light emitting diode (LED) with a contact that induces an electromagnetic field within in the LED for shaping the light emitted by the LED.

LEDs convert electrical energy into optical energy. In semiconductor LEDs, light is usually generated through recombination of electrons, originating from an n-type doped semiconductor layer, and holes originating from a p-type doped semiconductor layer. As used herein, the term "light" includes not just visible light, but also electromagnetic radiation having a wavelength outside that of the visible range, including infrared and ultraviolet radiation.

Prior bottom-emitting micro-LEDs ("μLEDs") include a semiconductor with a quantum well, a uniform p-contact at the top of the μLED structure, and an n-contact. When a current flows between the p-contact and the n-contact, light is emitted from the quantum well. The inner walls of the μLED reflect light, and if the LED has a semi-parabolic shape, the walls will direct the reflected light out the bottom of the LED. The shape of such μLEDs could improve the extraction efficiency of the μLED and the directionality of the emitted light beam over prior LEDs, such as traditional cuboid shaped LEDs. However, a cavity effect between the p-contact and the quantum well could create a sub-optimal radiation pattern in the emitted light. For example, if the cavity effect guides light that emitted from the quantum well straight towards the bottom of the LED, rather than towards the reflecting walls the μLED structure, the light that is emitted will not be collimated and instead will diverge after exiting the μLED.

SUMMARY

Embodiments relate to a light emitting structure with a contact that shapes the emitted light. In particular, the contact can induce an electromagnetic field within the light emitting structure that causes the light exiting the light emitting structure to be collimated.

In some embodiments, a light emitting structure includes a light emitting diode, a first contact, and a second contact. The light emitting diode includes a body of transparent semiconductor material. The body has a top surface and a light emitting region below the top surface. The light emitting region is configured to emit light in response to passing current through the light emitting region; the emitted light passes through the body of the light emitting diode. The first contact is connected to the top surface of the body and has a spiral shape to induce an electromagnetic field. The electromagnetic field shapes the light that is emitted from the light emitting region and passes through the body of the light emitting diode. The second contact is connected to a surface of the light emitting structure. A voltage difference can be applied across the first contact and the second contact to generate the current through the light emitting region.

In some embodiments, the shaped light is collimated. In some embodiments, the light emitting diode includes a P-GaN region with the top surface, a quantum well forming the light emitting region, and an N-GaN region below the quantum well. The second contact may be connected to the N-GaN region of the light emitting diode.

In some embodiments, the first contact is configured to reflect light emitted by the light emitting region. In some embodiments, the body of the light emitter diode is shaped as a mesa to reflect at least a portion of light that is projected towards the top surface back to a bottom surface of the body at an opposite side of the top surface.

In some embodiments, the voltage difference is oscillated with a frequency to induce the electromagnetic field. In some embodiments, the first contact and the second contact are coupled to a driver for applying the voltage difference at a driving frequency that is lower than a frequency of the light emitted by the light emitter. The current driver may be a crystal oscillator. The driving frequency may be in the range of 1 GHz to 100 GHz.

Embodiments also relate to a method of operating a light emitting structure. Current is passed through a contact of a spiral shape connected to a top surface of a body of a light emitting diode made of transparent semiconductor material, inducing an electromagnetic field in response to passing the current through the contact of the spiral shape, and emitting light by a light emitting region below the top surface of the body. The emitted light is shaped by the induced electromagnetic field as the light passes through the body of the light emitting diode.

In some embodiments, passing the current through the contact of the spiral shape connected to the top surface involves applying a voltage difference across the contact of the spiral shape and a second contact to pass the current through the contact of the spiral shape and through the light emitting region. Inducing the electric field may involve oscillating the voltage difference with a driving frequency that is lower than a frequency of the light emitted by the light emitter. The driving frequency may be between 1 GHz and 100 GHz. In some embodiments, the method further involves tuning the shape of the induced electromagnetic field by adjusting the driving frequency.

In some embodiments, the shaped light is collimated. In some embodiments, the method further involves reflecting a portion of light that is projected towards the top surface back to a bottom surface of the body at an opposite side of the top surface.

DETAILED DESCRIPTION

Embodiments relate to a light emitting structure with an asymmetrical p-contact that shapes light emitted within the light emitting structure. Current travelling through the p-contact induces an electromagnetic field within the light emitting structure. The interaction between the electromagnetic field and the emitted light causes the light to be collimated when it exits the light emitting structure. For example, if the light emitting structure is a mesa-shaped bottom-emitting micro-LED (μLED) with reflective walls, light that exits the structure after being reflected is more collimated than light that exits directly from the structure without being reflected. Thus, if an electromagnetic field directs the light towards the walls, the output of the μLED will be more collimated.

Figure 1:
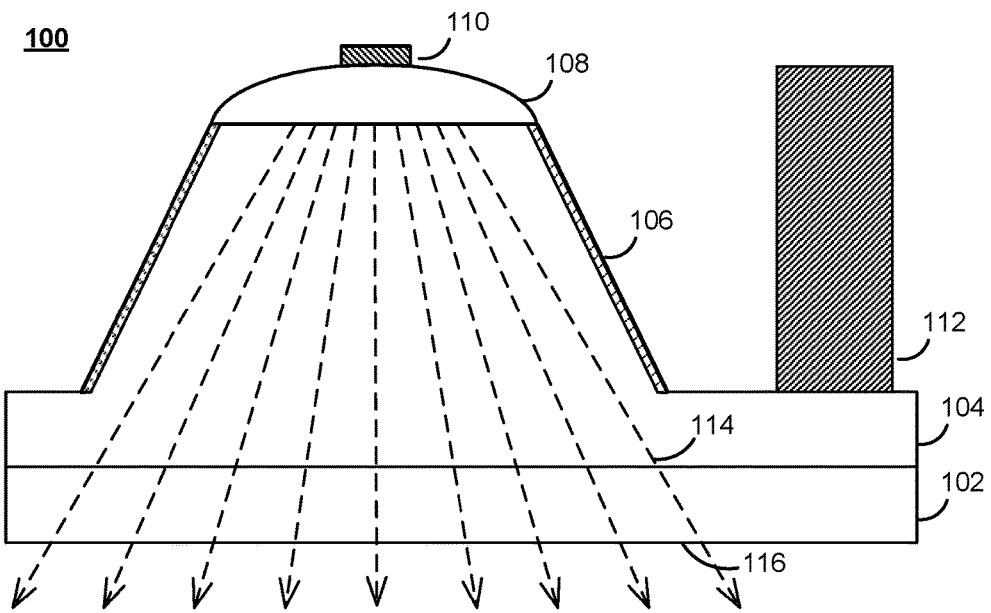
FIG. 1 is a cross sectional diagram of a prior art μLED.

Figure (FIG. 1 is a cross sectional diagram of a prior art μLED 100. A "μLED," or "MicroLED," refers to a particular type of LED having a small active light emitting area (e.g., less than 2,000 μm²). The μLED 100 includes, among other components, a LED substrate 102 (or "substrate 102") with a semiconductor epitaxial layer 104 disposed on the substrate 102, a p-contact 110 disposed on the epitaxial layer 104, and an n-contact 112 disposed on the epitaxial layer 104. The epitaxial layer 104 is shaped into a mesa 106. An active (or light emitting) layer 108 (or "active light emitting area") is included in the structure of the mesa 106. The active light emitting area may include a p-doped layer and a quantum well. The active layer 108 emits light when a voltage difference is applied between the p-contact 110 and the n-contact 112, causing a current to pass through the semiconductor epitaxial layer 104.

The substrate 102 may substantially include one or more of sapphire, gallium nitride, aluminum nitride, gallium arsenide, indium phosphide, gallium phosphide and/or silicon carbide. The semiconductor material for the epitaxial layer 104 and the active layer 108 may include one or more of indium gallium nitride, aluminum gallium phosphide, gallium arsenide, gallium arsenide phosphide, zinc selenide, or any combination of these materials such that a transparent light emitting semiconductor is formed.

The mesa 106 has a truncated top, on a side opposed to a light transmitting or emitting face 116 of the μLED 100. The mesa 106 has a near-parabolic shape to form a reflective enclosure for light generated within the μLED 100. When the light emitted from the light emitting layer 108 reflects off of the walls of the mesa 106 and/or the p-contact 110, the μLED 100 outputs collimated or quasi-collimated light that has a reduced beam angle compared to light emitted from a standard unfocused LED device. Collimating the light is beneficial because it increases the brightness level of light emitted from the small active light emitting area and prevents the spreading of emitted light into the beampath of other adjacent μLEDs or photodetectors. In typical operation, light is generated in the light emitting layer 108 and is emitted in all directions. Some light directly escapes from the light emitting surface 116 of the μLED 100. Other light is directed toward the walls and upper surface of the mesa 106 and is reflected back towards the light emitting surface 116, from where it escapes the device 100.

However, in some cases, much of the emitted light from the light emitting layer 108 is directed straight out of the light emitting face 116, and little of the light emitting by the light emitting layer 108 is reflected off of the side walls of the mesa 106. The arrows 114 show that when light emitted from the active layer 108 does not get reflected off the internal walls of the mesa 106, the light escapes straight out the μLED device 100. This can occur when certain μLED geometries that create undesirable radiation patterns. For example, if the size of an optical cavity within the light emitting layer 108 is an integer multiple of the quarter-wavelength of the emitted light, the optical cavity and the reflective p-contact 110 create constructive interference. The constructive interference strongly encourages the emitted light to travel in a particular direction, i.e., straight out the light emitting face 116.

One solution is to fabricate the μLED 100 with a geometry that avoids constructive interference. However, it can be difficult to fabricate the μLED 100 this precisely, especially as μLEDs are being pushed to smaller scales. In addition, even if constructive interference can be avoided, it is desirable to direct as much of the light as possible towards the walls a mesa-shaped μLED to maximize the collimation of the emitted light. Therefore, the μLEDs disclosed herein include an asymmetrical p-contact that induces an electromagnetic field for shaping the emitted light.

Figure 2:
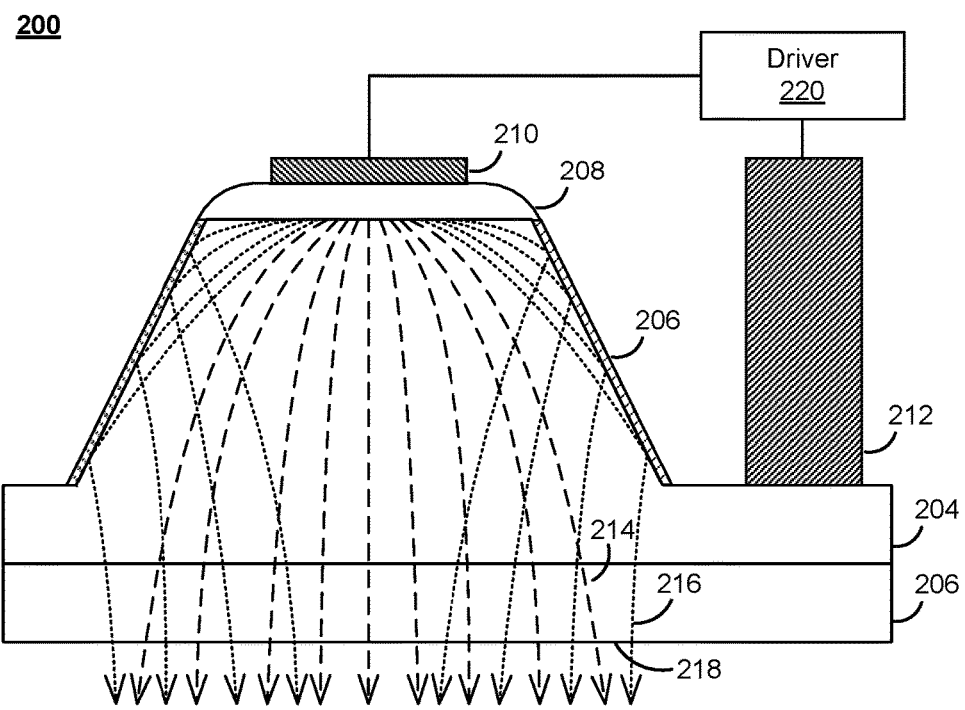
FIG. 2 is a cross sectional diagram a μLED having an asymmetric p-contact, according to one embodiment.

FIG. 2 is a cross sectional diagram a μLED 200 having an asymmetric p-contact, according to one embodiment. The μLED 200 includes, among other components, an LED substrate 202 with a semiconductor epitaxial layer 204 disposed on the substrate 202, an asymmetrical p-contact 210 disposed on the epitaxial layer 204, and an n-contact 212 disposed on the epitaxial layer 204. As in FIG. 1, the epitaxial layer 204 is shaped into a mesa 206. An active light emitting layer 208 is included in the structure of the mesa 206. The active light emitting area may include a quantum well. In particular, the epitaxial layer 204 may be n-doped, and the active light emitting area 208 may include a p-doped layer at the top of the area 208 (or, in some cases, a p+ layer above a p− layer), and a quantum well between the p-doped layer and the n-doped layer. A driver 220 applies a voltage difference between the p-contact 210 and the n-contact 212. The active layer 208 emits light when a voltage difference is applied between the p-contact 210 and the n-contact 212, causing a current to pass through the semiconductor epitaxial layer 204. In some embodiments, the mesa 206 is covered in a dielectric layer (not shown) in the region around the p-contact 210, while the p-contact 210 connects to the active layer 208 of the mesa 206. The mesa 206 has a truncated top, on a side opposed to a light transmitting or emitting face 218. The active layer 208 is formed immediately below the top surface of the mesa 206. The structure and materials of the various components of the μLED 200 are similar to those of the μLED 100 described with respect to FIG. 1, except the p-contact 210 is structured differently. In one embodiment, the epitaxial layer 204 is gallium nitride (GaN). The active layer 208 is P-doped GaN (P-GaN), and the remainder of the epitaxial layer 204 is N-doped GaN (N-GaN).

Figure 3:
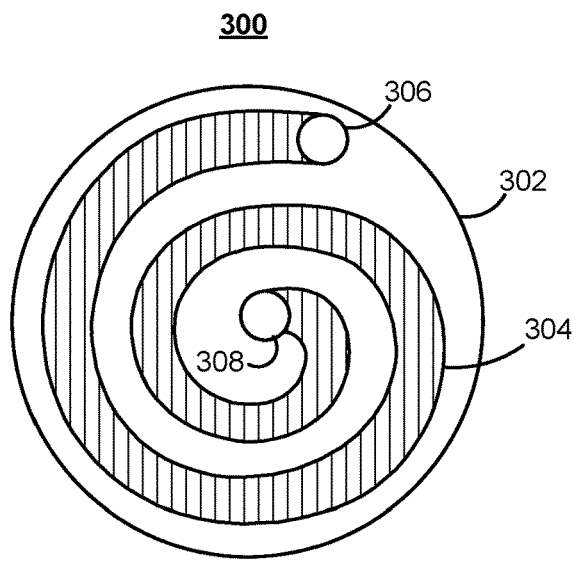
FIG. 3 is a top view a spiral-shaped p-contact, according to one embodiment.
Figure 4:
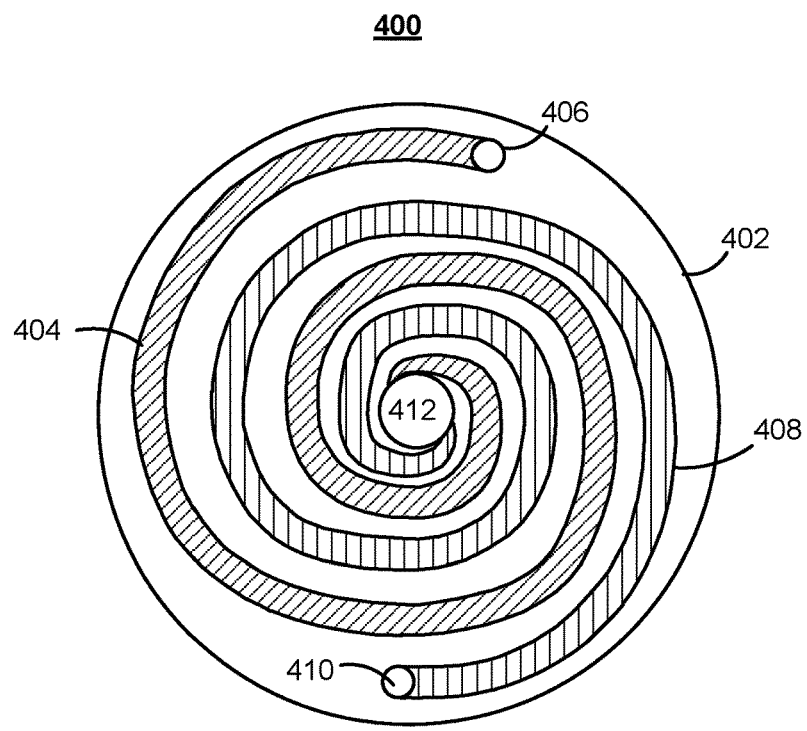
FIG. 4 is a top view of a double-spiral p-contact, according to one embodiment.

A typical p-contact, such as p-contact 110 in FIG. 1, is a solid metal contact point with the mesa 106. A current travels between the p-contact 110 and the n-contact 112, but no current travels along the p-contact 110. By contrast, the p-contact 210 is configured to carry a current that induces an electromagnetic field within the mesa 206. For example, as shown in FIGS. 3 and 4, the p-contact 210 may have a spiral shape that carries current along the spiral before injecting the current into the mesa 206. The electromagnetic field interacts with the light that is emitted from the light emitting layer 208 to change the path that the emitted light travels. For example, as shown in FIG. 2, the electromagnetic field pulls the light towards the walls of the mesa 206. The strength of the electromagnetic field may be strongest in the area closest to the p-contact 210, i.e., near the top of the mesa 206 and within the active layer 208 that emits the light.

The trajectories of the light emitted from the light emitting layer 208 and shaped by the electromagnetic field induced by the p-contact 210 are shown with two sets of arrows, arrows 214 and arrows 216. The arrows 214 show the path of light that travel directly from the light emitting layer 208 to the emitting face 218, without reflecting off of the wall of the mesa 206. However, the electromagnetic field has bent the trajectory of the light along arrows 214 relative to the trajectory of the light along arrows 114 in FIG. 1.

The arrows 216 show the path of light that, under the influence of the electromagnetic field, is directed towards the wall of the mesa 206. The light along arrows 216 reflect off of the mesa 206 and out the emitting face 218. As shown in FIG. 2, the portion of the arrows 216 following the reflection is also slightly bent; this part of the trajectory may also be influenced by the electromagnetic field.

The overall effect of the electromagnetic field in FIG. 2 is to collimate the light 214 and 216 that exits the emitting face 218. The light 114 in FIG. 1 is shown exiting the μLED 100 at a relatively wide angle, and it diverges as it travels further away from the μLED 100. By contrast, the light 214 and 216 that exits the μLED 200 exits along a relatively straight path, and it will diverge far less as it travels away from the μLED 200.

Different electromagnetic fields may affect the path of the emitted light in different ways. For example, an electromagnetic field induced by the p-contact 210 may cause a greater amount of the light to move towards the walls of the mesa 206 than shown in FIG. 2. An electromagnetic field induced by the p-contact 210 may cause some or all of the emitted light to be directed towards the top of the mesa 206 and the p-contact 210, which may also reflect light. The electromagnetic field may further direct at least some of the light reflected off the p-contact towards the walls of the mesa 206, rather than out the emitting face 218 of μLED 200. In other embodiments, if a broad output beam is desired, the electromagnetic field may direct the light directly towards the emitting face 218 and out the bottom of the μLED 200, without any reflection. In some embodiments, the electromagnetic field is tunable. For example, the electromagnetic field may be tuned by changing the frequency of the current that travels through the p-contact 210, which in turn changes the shape of the produced electromagnetic field.

Two exemplary arrangements for the p-contact 210 are shown in FIG. 3 and FIG. 4. FIG. 3 is a top view a spiral-shaped p-contact 300, according to one embodiment. The p-contact 300 includes a non-conducting portion 302 on which the p-contact is formed, and a spiral-shaped conducting portion 304. The conducting portion 304 has a current injection point 306 and a current exit point 308. In operation, a voltage is applied to the current injection point 306 and to an n-contact, such as n-contact 212, to cause current to flow from the current injection point 306, through the conducting portion 304, and to the current exit point 308. The current exits the p-contact 300 at current exit point 308, and is injected into the active layer of an LED, such as active layer 208 of the mesa 206 shown in FIG. 2. The flat, spiral pattern carrying current creates an asymmetric radiation pattern, i.e., an asymmetric electromagnetic field. The spiral pattern includes multiple loops that reinforce the strength of the electromagnetic field. This electromagnetic field interacts with the pattern of the light emitted the μLED (e.g., by an active layer such as active layer 208), creating or enhancing a desired pattern in the emitted light.

In some embodiments, the current may be tuned to a particular frequency to create the desired electromagnetic field. The voltage difference applied between the current injection point 306 and then-contact may be oscillated at the desired frequency. For example, the n-contact can be grounded, while the voltage applied to the current injection point 306 is oscillated. The frequency may be selected based on the geometry and emission properties of the μLED and/or the desired emission pattern of the μLED. In some embodiments, the current through the p-contact 300 is driven by a current driver, such as the driver 220 shown in FIG. 2. A crystal oscillator can be used to create a high-frequency current, e.g., a current in the range of 1 GHz to 100 GHz. The frequency of the emitted light may be higher (e.g., on the order of 10 times to 1000 times higher) than the frequency of the current for inducing the electromagnetic field; however, the induced electromagnetic field can still influence the shape of the high-frequency emitted light.

The p-contact can have other configurations. The p-contact may have multiple current injection points, multiple current exit points, or both multiple current injection points and multiple current exit points. For example, FIG. 4 is a top view of a double-spiral p-contact 400 with two current injection points and one current exit point, according to another embodiment. The p-contact 400 includes a non-conducting portion 402 on which the p-contact is formed, and two spiral-shaped conducting portions 404 and 408. The first conducting portion 404 has a current injection point 406, and the second conducting portion 408 has a different current injection point 410. The two conducting portions 404 and 408 share a single current exit point 412, where current from both of the conducting portions 404 and 408 exits the p-contact 300 and is injected into the active layer of an LED, such as active layer 208 of the mesa 206 shown in FIG. 2. The current traveling along this pattern also create an asymmetric radiation pattern, i.e., an asymmetric electromagnetic field. As with the pattern in FIG. 3, the double spiral pattern includes multiple loops to reinforce the strength of the electromagnetic field, and the electromagnetic field interacts with the pattern of the light emitted the μLED (e.g., by an active layer such as active layer 208), creating or enhancing a desired pattern of the emitted light.

The conducting portions 404 and 408 may have the same current, or they may be driven with different current. For example, the n-contact 212 may be held at ground, and the voltage applied to the first current injection point 406 may be oscillated with a different frequency from the voltage applied to the second current injection point 410. Further, different current drivers (e.g., crystals of different vibration frequencies) may be used to drive the currents injected into the first current injection point 406 and the second current injection point 410. In some cases, only one of the spirals may be used if a weaker electromagnetic field is desired.

It should be understood that any patterned p-contact for inducing an electromagnetic feature may be used. The p-contact may have shapes other than spirals. A patterned p-contact can be manufactured using any small-scale lithography technique, such as deep UV or ultra-deep UV lithography, electron beam lithography, or contact stamp lithography.

Figure 5:
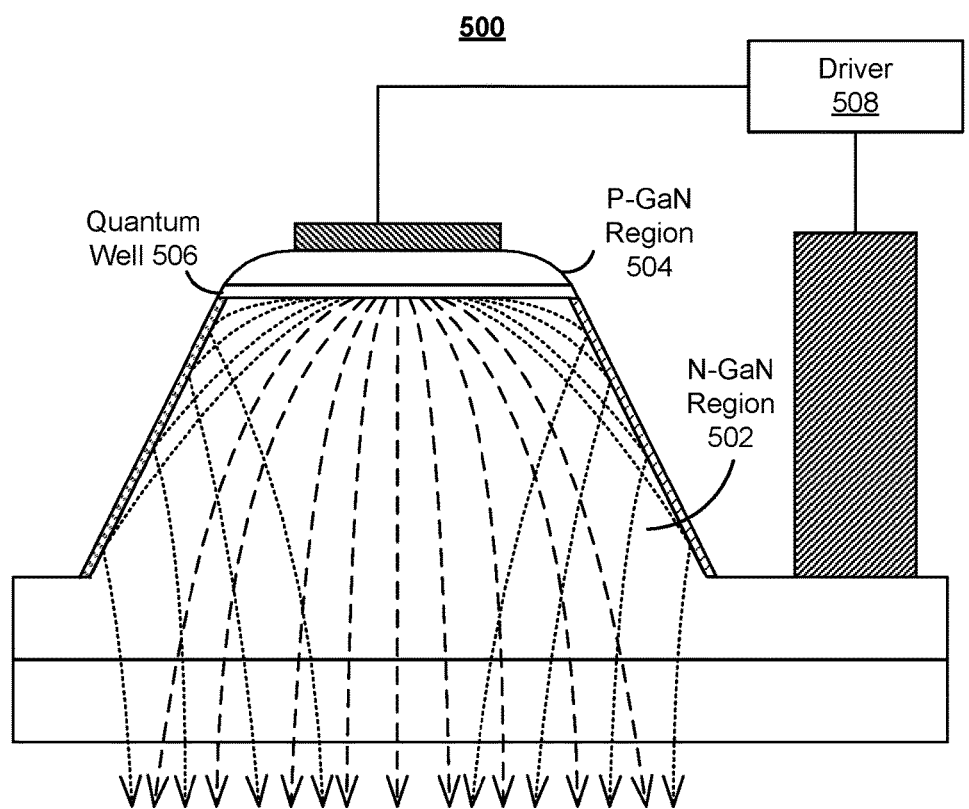
FIG. 5 is a cross sectional diagram of a particular embodiment of a μLED having an asymmetric p-contact, according to one embodiment.

FIG. 5 is a cross sectional diagram of a particular embodiment of a μLED 500 having an asymmetric p-contact, according to one embodiment. The structure of μLED 500 is similar to the μLED 200 shown in FIG. 2. In the embodiment shown in FIG. 5, the epitaxial layer 204 is an n-doped GaN (N-GaN) region 506. The active light emitting area 208 is shown as including a p-doped GaN (P-GaN) region 504 and a quantum well 506. The quantum well 506 is positioned between the N-GaN region 502 and the P-GaN region 504. FIG. 5 also includes a driver 508, which is an embodiment of the driver 220 shown in FIG. 2.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A light emitting structure comprising:
a light emitting diode (LED) comprising a mesa-shaped body of transparent semiconductor material, the mesa-shaped body comprising a top surface and a light emitting region below the top surface, the light emitting region configured to emit light in response to passing current through the light emitting region, the emitted light passing through the mesa-shaped body of the LED and through a bottom surface of the LED;
a first contact connected to the top surface of the mesa-shaped body, the first contact of a spiral shape to induce an electromagnetic field that shapes the light emitted from the light emitting region and passing through the mesa-shaped body of the LED; and
a second contact connected to a surface of the light emitting structure, wherein a voltage difference can be applied across the first contact and the second contact to generate the current through the light emitting region.

2. The light emitting structure of claim 1, wherein the first contact is further configured to reflect light emitted by the light emitting region.

3. The light emitting structure of claim 1, wherein the mesa-shaped body of the LED reflects at least a portion of light that is projected towards the top surface back to a bottom surface of the mesa-shaped body at an opposite side of the top surface.

4. The light emitting structure of claim 1, wherein the shaped light is collimated.

5. The light emitting structure of claim 4, wherein the voltage difference is oscillated with a frequency to induce the electromagnetic field.

6. The light emitting structure of claim 4, wherein the LED comprises a P-GaN region with the top surface, a quantum well forming the light emitting region, and an N-GaN region below the quantum well, the second contact connected to the N-GaN region of the LED.

7. The light emitting structure of claim 1, wherein the first contact and the second contact are coupled to a driver for applying the voltage difference at a driving frequency that is lower than a frequency of the light emitted by the light emitting region.

8. The light emitting structure of claim 7, wherein the driver comprises a crystal oscillator.

9. The light emitting structure of claim 7, wherein the driving frequency is in the range of 1 GHz to 100 GHz.

10. A method of operating a light emitting structure comprising:
passing current through a contact of a spiral shape connected to a top surface of a mesa-shaped body of a light emitting diode made of transparent semiconductor material;
inducing an electromagnetic field in response to passing the current through the contact of the spiral shape; and
emitting light by a light emitting region below the top surface of the mesa-shaped body, the emitted light shaped by the induced electromagnetic field as the light passes through the mesa-shaped body of the light emitting diode.

11. The method of claim 10, wherein the shaped light is collimated.

12. The method of claim 10, further comprising:
reflecting a portion of light that is projected towards the top surface back to a bottom surface of the mesa-shaped body at an opposite side of the top surface.

13. The method of claim 10, wherein passing the current through the contact of the spiral shape connected to the top surface comprises:
applying a voltage difference across the contact of the spiral shape and a second contact to pass the current through the contact of the spiral shape and through the light emitting region.

14. The method of claim 13, wherein inducing the electromagnetic field comprises:
oscillating the voltage difference with a driving frequency that is lower than a frequency of the light emitted by the light emitting region.

15. The method of claim 14, wherein the driving frequency is between 1 GHz and 100 GHz.

16. The method of claim 14, further comprising:
tuning a shape of the induced electromagnetic field by adjusting the driving frequency.

* * * * *